(12) United States Patent
Wang et al.

(10) Patent No.: US 11,158,840 B2
(45) Date of Patent: Oct. 26, 2021

(54) ORGANIC LIGHT EMITTING DISPLAY PANEL, METHOD FOR MANUFACTURING THE SAME AND DISPLAY DEVICE THEREOF

(71) Applicants: BEIJING BOE DISPLAY TECHNOLOGY CO., LTD., Beijing (CN); BOE TECHNOLOGY GROUP CO., LTD., Beijing (CN)

(72) Inventors: Qiang Wang, Beijing (CN); Zengbiao Sun, Beijing (CN); Liping Luo, Beijing (CN); Huishuang Liu, Beijing (CN); Zhenshan Li, Beijing (CN); Jie Zhao, Beijing (CN); Mingliang Zhao, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 12 days.

(21) Appl. No.: 16/330,324

(22) PCT Filed: Jun. 5, 2018

(86) PCT No.: PCT/CN2018/089932
§ 371 (c)(1),
(2) Date: Mar. 4, 2019

(87) PCT Pub. No.: WO2019/033830
PCT Pub. Date: Feb. 21, 2019

(65) Prior Publication Data
US 2019/0229295 A1 Jul. 25, 2019

(30) Foreign Application Priority Data
Aug. 18, 2017 (CN) .......................... 201710710508.4

(51) Int. Cl.
H01L 51/52 (2006.01)
H01L 27/32 (2006.01)
H01L 51/56 (2006.01)

(52) U.S. Cl.
CPC .......... H01L 51/5293 (2013.01); H01L 27/32 (2013.01); H01L 51/5265 (2013.01);
(Continued)

(58) Field of Classification Search
None
See application file for complete search history.

(56) References Cited

U.S. PATENT DOCUMENTS 6,704,335 B1 3/2004 Koyama et al.
2006/0066220 A1* 3/2006 Choong .............. H01L 51/5265
313/501

(Continued)

FOREIGN PATENT DOCUMENTS

CN 1983665 A 6/2007
CN 103928635 A 7/2014

(Continued)

OTHER PUBLICATIONS

PCT International Search Report, Application No. PCT/CN2018/089932, dated Aug. 23, 2018, 5 pages: with English translation.

(Continued)

*Primary Examiner* — Nilufa Rahim
(74) *Attorney, Agent, or Firm* — Armstrong Teasdale LLP (57) ABSTRACT

The present disclosure provides an organic light emitting display panel, a method for manufacturing the same, and a display device thereof. The organic light emitting display panel includes a substrate, a first electrode located on the substrate, a light emitting layer located on a side of the first electrode away from the substrate, a second electrode located on a side of the light emitting layer away from the (Continued)

first electrode, and a polarization reflective layer located between the substrate and the first electrode or located on a side of the second electrode away from the light emitting layer.

13 Claims, 4 Drawing Sheets

(52) U.S. Cl.
CPC .......... *H01L 51/5271* (2013.01); *H01L 51/56* (2013.01); *H01L 27/3241* (2013.01)

(56) References Cited

U.S. PATENT DOCUMENTS

| | | |
|---|---|---|
| 2007/0085476 A1 | 4/2007 | Hirakata et al. |
| 2008/0169479 A1* | 7/2008 | Xu .......................... H01L 33/20 257/94 |
| 2009/0015142 A1* | 1/2009 | Potts ....................... B82Y 20/00 313/504 |
| 2015/0228931 A1* | 8/2015 | Lamansky .......... H01L 51/5275 257/40 |
| 2016/0285036 A1* | 9/2016 | Wang .................. H01L 51/5275 |

FOREIGN PATENT DOCUMENTS

| | | |
|---|---|---|
| CN | 104466026 A | 3/2015 |
| CN | 104823299 A | 8/2015 |
| CN | 105118849 A | 12/2015 |
| CN | 105226197 A | 1/2016 |
| CN | 105378521 A | 3/2016 |
| CN | 206179870 U | 5/2017 |
| CN | 107528008 A | 12/2017 |

OTHER PUBLICATIONS

PCT Written Opinion, Application No. PCT/CN2018/089932, dated Aug. 29, 2018, 5 pages.: with English translation of relevant part.
China First Office Action, Application No. 201710710508.4, dated Oct. 8, 2018, 17 pps.: with English translation.

* cited by examiner

ORGANIC LIGHT EMITTING DISPLAY PANEL, METHOD FOR MANUFACTURING THE SAME AND DISPLAY DEVICE THEREOF

CROSS REFERENCE TO RELATED APPLICATIONS

This patent application is a National Stage Entry of PCT/CN2018/089932 filed on Jun. 5, 2018, which claims the benefit and priority of Chinese Patent Application No. 201710710508.4 filed on Aug. 18, 2017, the disclosures of which are incorporated by reference herein in their entirety as part of the present application.

BACKGROUND

The present disclosure relates to the field of organic optoelectronics, and in particular, to an organic light emitting display panel, a method for manufacturing the same, and a display device thereof.

An organic light emitting display (OLED) is a thin film light emitting device fabricated using an organic semiconductor material and driven by a direct current voltage. The organic light emitting display technology is different from the conventional LCD display technology. The organic light emitting display technology does not require a backlight and uses a very thin organic material coating and a glass substrate. When a current passes through, these organic materials emit light. Moreover, the organic light emitting display screen can be made lighter and thinner, and has the advantages of large viewing angle, wide color gamut, large brightness, power saving, and flexible displaying, etc. The organic light emitting display panel may be classified into a top emission organic light emitting display panel and a bottom emission organic light emitting display panel according to a direction along which the light is emitted.

However, the current organic light emitting display panel, the method for manufacturing the same, and the display device thereof still need to be improved.

BRIEF DESCRIPTION

In one aspect of the disclosure, the present disclosure provides an organic light emitting display panel. The organic light emitting display panel includes a substrate, a first electrode located on the substrate, a light emitting layer located on a side of the first electrode away from the substrate, a second electrode located on a side of the light emitting layer away from the first electrode, and a polarization reflective layer located between the substrate and the first electrode or located on a side of the second electrode away from the light emitting layer.

According to an embodiment of the present disclosure, the polarization reflective layer includes a distributed Bragg reflector and a polarization grating stacked with each other.

According to an embodiment of the present disclosure, the distributed Bragg reflector includes a plurality of sub-layers, the polarization grating consists of at least one of the sub-layers located on a light exit side of the distributed Bragg reflector.

According to an embodiment of the present disclosure, a total number of layers of the plurality of sub-layers is in a range from 10 to 30.

According to an embodiment of the present disclosure, a material of the plurality of sub-layers includes a compound or a single substance of elements of the same group.

According to an embodiment of the present disclosure, the plurality of sub-layers include a first sub-layer and a second sub-layer that are alternately stacked. A material of one of the first sub-layer and the second sub-layer includes silicon nitride, and a material of the other of the first sub-layer and the second sub-layer includes silicon oxide.

According to an embodiment of the present disclosure, a thickness of the first sub-layer is in a range from 68 to 73 nm, and a thickness of the second sub-layer is in a range from 103 to 106 nm.

According to an embodiment of the present disclosure, a grating period of the polarization grating is in a range from 198 to 202 nm, a height of the polarization grating is in a range from 0.9 to 1.1 µm, and a duty cycle of the polarization grating is in a range from 0.5 to 0.7.

According to an embodiment of the present disclosure, the first electrode is an anode and the second electrode is a cathode.

In another aspect of the disclosure, the present disclosure provides a display device. According to an embodiment of the present disclosure, the display device includes the organic light emitting display panel as described above.

In another aspect of the present disclosure, the present disclosure provides a method for manufacturing an organic light emitting display panel. According to an embodiment of the present disclosure, the method includes providing a substrate, forming a first electrode on the substrate, forming a light emitting layer on a side of the first electrode away from the substrate, and forming a second electrode on a side of the light emitting layer away from the first electrode. The method further includes forming a polarization reflective layer between the substrate and the first electrode or on a side of the second electrode away from the light emitting layer.

According to an embodiment of the present disclosure, the polarization reflective layer includes a distributed Bragg reflector and a polarization grating stacked with each other.

According to an embodiment of the present disclosure, the distributed Bragg reflector includes a plurality of sub-layers, the polarization grating consists of at least one of the sub-layers located on a light exit side of the distributed Bragg reflector.

According to an embodiment of the present disclosure, forming the polarization reflective layer between the substrate and the first electrode includes depositing the plurality of sub-layers on the substrate, so as to form the distributed Bragg reflector, and forming a plurality of grooves having the same width and equally spaced apart in the at least one of the sub-layers on the light exit side of the distributed Bragg reflector to form the polarization grating.

According to an embodiment of the present disclosure, forming the polarization reflective layer on a side of the second electrode away from the light emitting layer includes forming a first set of sub-layers of the plurality of sub-layers on the side of the second electrode, forming a plurality of grooves having the same width and equally spaced apart in the first set of sub-layers to form the polarization grating, and forming a second set of sub-layers on the first set of sub-layers to form the distributed Bragg reflector.

According to an embodiment of the present disclosure, the plurality of sub-layers include a first sub-layer and a second sub-layer that are alternately stacked. A thickness of the first sub-layer is in a range from 68 to 73 nm, and a thickness of the second sub-layer is in a range from 103 to 106 nm. A total number of layers of the plurality of sub-layers is in a range from 10 to 30. A material of one of the first sub-layer and the second sub-layer includes silicon nitride, and a material of the other of the first sub-layer and the second sub-layer includes silicon oxide.

BRIEF DESCRIPTION OF THE DRAWINGS

The above and/or additional aspects and advantages of the present disclosure will become apparent and readily understood from the description of the embodiments in conjunction with the following drawings.

DETAILED DESCRIPTION

The embodiments of the present disclosure are described in detail below, and the examples of the embodiments are illustrated in the drawings, wherein throughout the specification, the same or similar reference numerals are used to refer to the same or similar elements or elements having the same or similar functions. The embodiments described below with reference to the accompanying drawings are illustrative, are intended to explain the present disclosure only, and are not to be construed as limiting.

The present disclosure is based on the discovery and recognition of the following facts and problems by the inventors.

At present, organic light emitting display panels often have problems of low brightness and poor light-emitting quality. The inventors have conducted intensive research and a large number of experiments and found that this is mainly caused by the low emissivity of an anode of the organic light emitting display panel and the polarization instability of the light source due to self-luminescence of a light emitting layer of the organic light emitting display panel. Taking a top emission organic light emitting display panel as an example, in order to ensure a high injection efficiency of holes, the anode of the top emission organic light emitting display panel generally adopts a material having a higher work function, such as ITO, etc. However, the anode of the above organic light emitting display panel still cannot reflect 100% of the light, which causes a decrease in external quantum efficiency, and on the other hand, after the transmitted light entering into the backboard circuit, the photo-generated carriers are generated in the circuit, thereby affecting the stability of the circuit.

Further, the inventors have found that since the organic light emitting display panel is a self-luminous panel and the polarization directions of the light sources generated are different, such that the polarization-stable output light cannot be obtained, thereby affecting the light-emitting quality of the panel. In the prior art, in order to improve the reflectivity of an anode of the top emission organic light emitting display panel, a combination of ITO/Ag/ITO is generally used, which has the advantages of high work function of ITO and high reflectivity of Ag. However, the inventors have found that, although Ag has a high reflectivity, it can only reach to about 90%, that is, some of the light is still absorbed or projected into the backboard circuit. For the organic light emitting display panel, since the voltage compensation is required, the backboard circuit is relatively complicated and sensitive, and the photo-generated carriers generated by the projected light in the backboard circuit greatly affect the stability of the backboard circuit, which in turn affects the performance of the panel. However, in the prior art, in order to solve the problem that the polarization of the organic light emitting display panel is unstable, a method of attaching a polarizer to the cover glass is often employed. The inventors have found that, although attaching the polarizer to the cover glass can polarize the emitted light, the adhesion of the polarizer causes an increase in the thickness of the screen, which is disadvantageous to the heat dissipation of the panel, and which is contrary to the developing direction of developing the ultra-thin, integrated and stable electronic product.

The present disclosure is intended to alleviate or solve at least one of the above mentioned problems to at least some extent.

Figure 1:
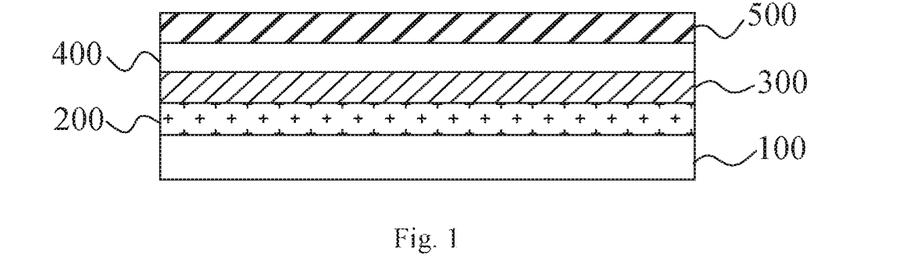
FIG. 1 illustrates a schematic cross-sectional view of an organic light emitting display panel according to an embodiment of the present disclosure.
Figure 2:
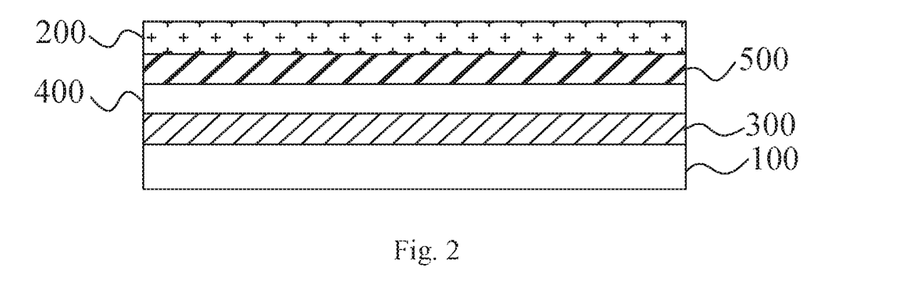
FIG. 2 illustrates a schematic cross-sectional view of an organic light emitting display panel according to an embodiment of the present disclosure.

In one aspect of the disclosure, an organic light emitting display panel is provided. According to an embodiment of the present disclosure, referring to FIG. 1 and FIG. 2, the organic light emitting display panel includes a substrate 100, a first electrode, a light emitting layer 400, a second electrode, and a polarization reflective layer 200. The first electrode is located on the substrate 100. The light emitting layer 400 is located on a side of the first electrode away from the substrate 100. The second electrode is located on a side of the light emitting layer 400 away from the first electrode. The polarization reflective layer 200 is located between the substrate 100 and the first electrode (as shown in FIG. 1), or the polarization reflective layer 200 is located on a side of the second electrode away from the light emitting layer 400 (as shown in FIG. 2). According to an embodiment of the present disclosure, the first electrode may be an anode 300 and the second electrode may be a cathode 500. Therefore, the reflectivity of the electrode of the organic light emitting display panel can be improved, the brightness and stability of the panel can be improved, and the polarization characteristics of the output light of the panel can be improved, thereby improving the light-emitting quality of the panel.

Hereinafter, each structure of the organic light emitting display panel will be described in detail according to a specific embodiment of the present disclosure.

Here, the type of the organic light emitting display panel is not particularly limited, and those skilled in the art can design according to specific conditions. For example, according to an embodiment of the present disclosure, the organic light emitting display panel may be a top emission organic light emitting display panel. As shown in FIG. 1, the polarization reflective layer 200 is located between the substrate 100 and the anode 300. According to another embodiment of the present disclosure, the organic light emitting display panel may also be a bottom emission organic light emitting display panel. As shown in FIG. 2, the polarization reflective layer 200 is located on a side of the cathode 500 away from the light-emitting layer 400.

Here, a material of the substrate is not particularly limited, and those skilled in the art can select and design according to specific conditions. For example, according to an embodiment of the present disclosure, the substrate 100 may be composed of amorphous silicon, and may also be composed of polycrystalline silicon. According to an embodiment of the present disclosure, in order to realize the use of the organic light emitting display panel, it is also necessary to provide a backboard circuit on the substrate 100, thereby controlling display of the organic light emitting display panel with the backboard circuit.

Here, materials of the anode and the cathode are also not particularly limited as long as the anode material has a higher work function and the cathode material has a lower work function, and those skilled in the art can design according to the specific conditions. For example, according to an embodiment of the present disclosure, the anode 300 may be composed of ITO/Ag/ITO. Thus, the anode has a higher hole injection efficiency and a higher reflectivity. According to an embodiment of the present disclosure, the cathode 500 may be composed of a Mg/Ag alloy. Thereby, the cathode has a higher electron injection efficiency.

In addition, although Ag has a higher reflectivity, it can only reach to 90%, and ITO has a high transmittance. It can be understood by those skilled in the art that when the panel is a top emission organic light emitting display panel, since the anode 300 is composed of a transparent conductive material ITO and metal Ag, the overall reflectivity of the anode is low, and light passing through the anode enters into the backboard, thereby affecting the stability of the panel. According to an embodiment of the present disclosure, the polarization reflective layer 200 is located between the anode 300 and the substrate 100, such that the light transmitted through the anode 300 can be reflected. In addition, due to the special structure of the polarization reflective layer 200, the reflectivity can be up to 99%, thereby improving the reflectivity and increasing the brightness of the panel.

Figure 3:
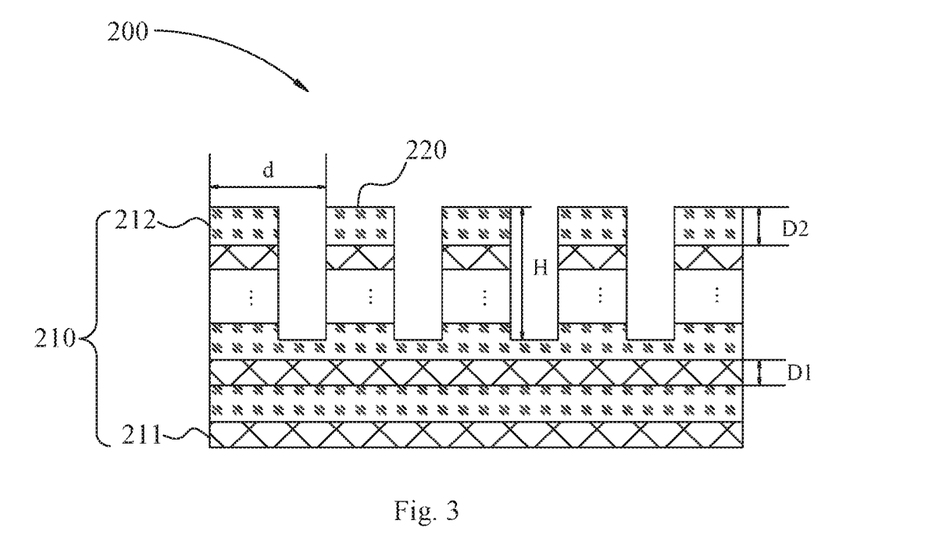
FIG. 3 illustrates a schematic cross-sectional view of a polarization reflective layer according to an embodiment of the present disclosure.

According to an embodiment of the present disclosure, referring to FIG. 3, the polarization reflective layer 200 includes a distributed Bragg reflector 210 and a polarization grating 220 stacked with each other. The distributed Bragg reflector 200 includes a plurality of sub-layers. Regarding a total number of layers of the sub-layers, further design is required. Those skilled in the art can understand that if the number of layers of the sub-layers is more, the reflectivity of the distributed Bragg reflector 210 is higher, but at the same time, the overall thickness of the panel is increased, which is contrary to the design concept of ultra-thin panel. If the number of layers of the sub-layers is less, a high reflectivity cannot be achieved. Thus, according to an embodiment of the present disclosure, the total number of layers of the sub-layers may be in a range from 10 to 30. According to a specific embodiment of the present disclosure, the total number of layers of the sub-layers may also be in a range from 15 to 25. Thereby, the panel is made to have a suitable thickness while ensuring a high reflectivity.

According to an embodiment of the present disclosure, the material of the plurality of sub-layers includes a compound or a single substance of elements of the same group. Those skilled in the art will appreciate that adjacent sub-layers are composed of different materials. In the present disclosure, "a compound or a single substance of elements of the same group" means that a compound or a single substance constituting adjacent two sub-layers contains elements of the same group. For example, adjacent sub-layers may be composed of aluminum and gallium arsenide, respectively, or may be composed of silicon oxide and silicon nitride, respectively. Thus, a sub-layer of the distributed Bragg reflectors can be constructed using materials from a wide variety of sources as described above.

According to an embodiment of the present disclosure, the selection of the sub-layer material should also take the quality of the interface between the film layer and the sub-layer into account. That is, there should be less interface defects and a higher degree of matching between the film layer and the sub-layer. It should be noted that the "film layer" means a film layer as a deposition substrate for the sub-layer. According to a specific embodiment of the present disclosure, when the panel is a top emission organic light emitting display panel, the film layer as a deposition substrate for the sub-layer is the substrate 100. As previously described, the substrate 100 may be composed of amorphous silicon or polycrystalline silicon. In order to have a higher interface quality between the sub-layer and the substrate 100, according to a specific embodiment of the present disclosure, the sub-layer may be composed of silicon oxide or silicon nitride.

According to an embodiment of the present disclosure, the sub-layer may include a first sub-layer 211 and a second sub-layer 212 that are alternately stacked. Here, the stacking order of the first sub-layer and the second sub-layer is not particularly limited, and those skilled in the art can design according to specific conditions. For example, when the panel is a top emission organic light emitting display panel, the first sub-layer 211 may be located on the substrate 100, and the second sub-layer 212 is located on a side of the first sub-layer 211 away from the substrate 100, and the first sub-layer 211 and the second sub-layer 212 are alternately stacked in this order. Alternatively, the second sub-layer 212 may be located on the substrate 100, the first sub-layer 211 may be located on a side of the second sub-layer 212 away from the substrate 100, and the second sub-layer 212 and the first sub-layer 211 are alternately stacked in this order. According to an embodiment of the present disclosure, the first sub-layer 211 and the second sub-layer 212 may be composed of silicon nitride and silicon oxide, respectively. According to an embodiment of the present disclosure, the thickness of the first sub-layer may be in a range from 68-73 nm (D1 as shown in FIG. 3), and the thickness of the second sub-layer may be in a range from 103-106 nm (D2 as shown in FIG. 3). According to a specific embodiment of the present disclosure, the thickness of the first sub-layer may be 71.3 nm, and the thickness of the second sub-layer may be 105 nm. Thereby, the distributed Bragg reflector can be made to have a suitable thickness.

Figure 4:
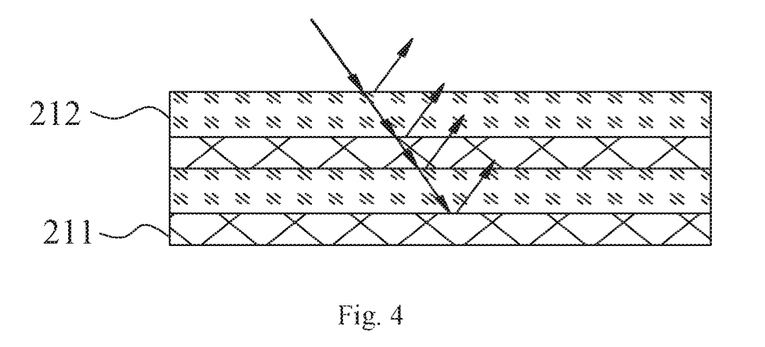
FIG. 4 illustrates a schematic view of a reflection principle of a distributed Bragg reflector according to an embodiment of the present disclosure.

According to an embodiment of the present disclosure, the principle that the distributed Bragg reflector 210 has a higher reflectivity is as shown in FIG. 4. When a light is irradiated onto the surface of the sub-layer (for example, the second sub-layer), the second sub-layer will reflect the light, which can be referred as the first reflection. A part of the light not reflected is irradiated to the surface of the first sub-layer through the second sub-layer. This part of the light is reflected by the first sub-layer, which can be referred as the second reflection. Remaining part of the light not be reflected will be irradiated to the surface of the underlying second sub-layer through the first sub-layer. This remaining part of the light will be reflected by the second sub-layer, which can be referred as the third reflection. As such, the transmitted light is reflected. According to a specific embodiment of the present disclosure, the first sub-layer 211 may have a refractive index of 2.0, and the second sub-layer 212 may have a refractive index of 1.35, thereby the distributed Bragg reflectors, which is formed by alternately stacking the first sub-layer and the second sub-layer, has a higher reflectivity.

According to an embodiment of the present disclosure, the polarization reflective layer 200 includes a polarization grating 220. Referring to FIG. 3, the polarization grating 220 is composed of at least one sub-layer located on the light emit side of the distributed Bragg reflector 210. Thus, a distributed Bragg reflector can be used to form the polarization grating, thereby saving material. Regarding the parameters of the polarization grating 220, according to an embodiment of the present disclosure, the grating period may be in a range from 198 to 202 nm (d as shown in FIG. 3), and the height may be in a range from 0.9 to 1.1 μm (H as shown in FIG. 3), the duty cycle may be in a range from 0.5 to 0.7. According to a specific embodiment of the present disclosure, the grating period of the polarization grating 220 may be 200 nm, the height of which may be 1 μm, and the duty cycle of which may be 0.6. Since the equivalent refractive index of the exiting light having the polarization direction perpendicular to the polarization grating 220 is different from the equivalent refractive index of the exiting light parallel to the polarization grating 220, the output external quantum efficiency of the two polarized lights is different, so that the polarization stability of the panel can be improved.

Figure 5:
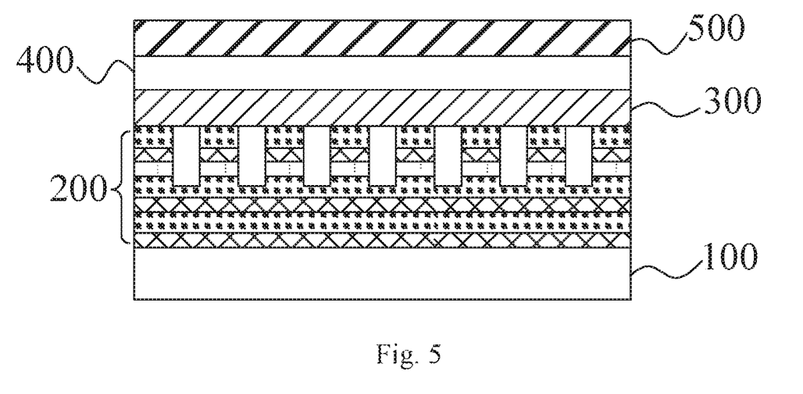
FIG. 5 illustrates a schematic cross-sectional view of an organic light emitting display panel according to an embodiment of the present disclosure.
Figure 6:
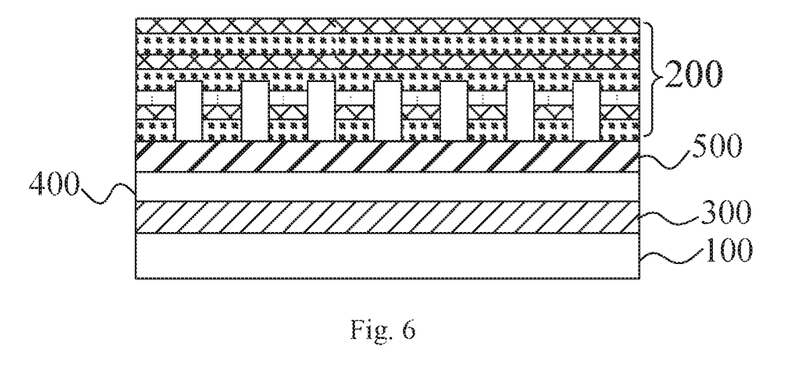
FIG. 6 illustrates a schematic cross-sectional view of an organic light emitting display panel according to an embodiment of the present disclosure.

FIGS. 5 and 6 illustrate schematic cross-sectional views respectively corresponding to FIGS. 1 and 2 when the polarization reflective layer includes the distributed Bragg reflector and the polarization grating stacked with each other, respectively.

It can be understood by those skilled in the art that, in order to obtain a better display effect of the organic light emitting display panel, the organic light emitting display panel may further include a hole transport layer and a hole injection layer, an electron transport layer and an electron injection layer, and a cover glass, etc. The hole transport layer and the hole injection layer are located between the anode and the light emitting layer, and the electron transport layer and the electron injection layer are located between the light emitting layer and the cathode, so as to ensure injection and transport of holes and electrons. A cover glass is located on a side of the cathode away from the light emitting layer, and is connected by a sealant to encapsulate the panel.

In another aspect of the present disclosure, a display device is provided. According to an embodiment of the present disclosure, the display device includes the organic light emitting display panel as described above. Thus, this display device has all of the features and advantages of the organic light emitting display panel as described above, which will not be described herein. In general, the display device has higher brightness and higher light-emitting quality.

In another aspect of the present disclosure, a method for manufacturing an organic light emitting display panel is provided. According to an embodiment of the present disclosure, the organic light emitting display panel manufactured by the method may be the organic light emitting display panel as described above. Thus, the organic light emitting display panel manufactured by the method may have the same features and advantages as those of the organic light emitting display panel as described above, and details are not described herein again. According to an embodiment of the present disclosure, referring to FIG. 7, the method includes steps S701 to S704.

Figure 7:
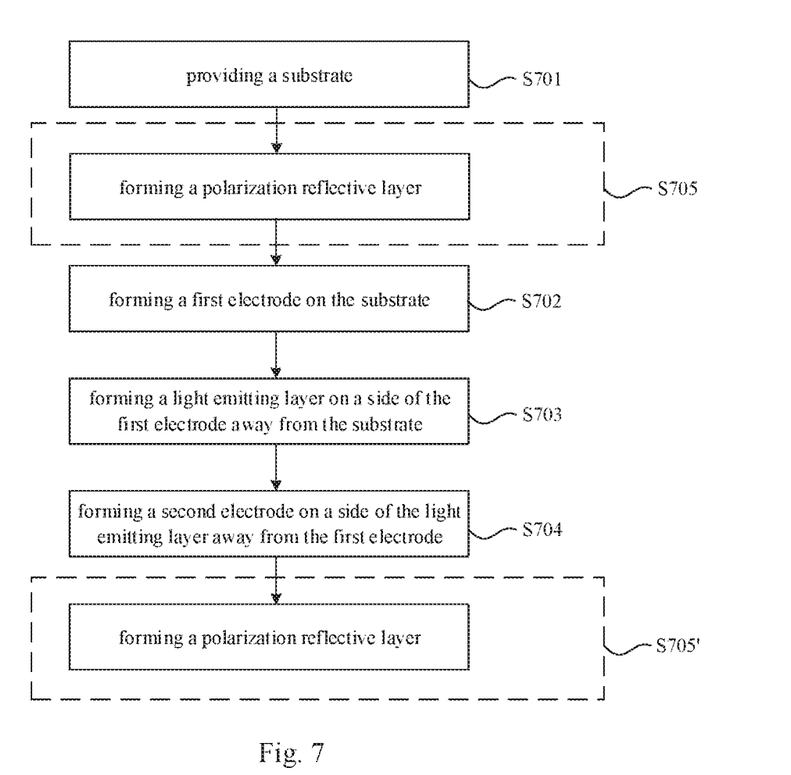
FIG. 7 illustrates a flow chart of a method for manufacturing an organic light emitting display panel according to an embodiment of the present disclosure.

S701: providing a substrate.

S702: forming a first electrode on the substrate.

According to an embodiment of the present disclosure, in this step, the first electrode is formed on the substrate. According to an embodiment of the present disclosure, the first electrode may be an anode. The materials of the substrate and the anode have been described in detail above and will not be described herein. For example, according to an embodiment of the present disclosure, the substrate may be composed of amorphous silicon or polycrystalline silicon, and the anode may be composed of ITO/Ag/ITO. According to an embodiment of the present disclosure, in order to realize the use of the organic light emitting display panel, it is also required to provide a backboard circuit on the substrate. Specifically, the backboard circuit can be obtained by a semiconductor process such as deposition and photolithography on the substrate. According to an embodiment of the present disclosure, an ITO/Ag/ITO layer is deposited on a substrate having a backboard circuit, to form an anode. Thereby, the display of the organic light emitting display panel can be controlled by the backboard circuit.

S703: forming a light emitting layer on a side of the first electrode away from the substrate.

According to an embodiment of the present disclosure, in this step, the light emitting layer is formed on a side of the first electrode away from the substrate. Specifically, the organic light emitting material is evaporated on a side of the anode away from the substrate, to form the light emitting layer. It can be understood by those skilled in the art that, before the evaporation of the light emitting layer, a hole transport layer and a hole injection layer may be formed by evaporating on a side of the anode away from the substrate. That is, the hole transport layer and the hole injection layer are located between the anode and the light emitting layer.

S704: forming a second electrode on a side of the light emitting layer away from the first electrode.

According to an embodiment of the present disclosure, in this step, the second electrode is formed on a side of the light emitting layer away from the first electrode. According to an embodiment of the present disclosure, the second electrode may be a cathode. The material of the cathode has been described in detail above and will not be described again here. For example, according to an embodiment of the present disclosure, the cathode may be composed of a Mg/Ag alloy. According to an embodiment of the present disclosure, a Mg/Ag alloy is sputtered on a side of the light emitting layer away from the anode, to form the cathode. It can be understood by those skilled in the art that, before the sputtering of the cathode, the electron transport layer and the electron injection layer can be formed by evaporating on a side of the light emitting layer away from the anode. That is, the electron transport layer and the electron injection layer are located between the cathode and the light emitting layer.

Further, the method may further include step S705 or step S705'. According to an embodiment of the present disclosure, when the panel is a bottom emission organic light emitting display panel, after step S701 and before step S702, the method further includes step S705, that is, forming a polarization reflective layer between the substrate and the first electrode. According to another embodiment of the present disclosure, after step S704, the method further includes step S705', that is, when the panel is a top emission organic light emitting display panel, in step S705', a polarization reflective layer is formed on a side of the second electrode away from the light emitting layer.

According to an embodiment of the present disclosure, the polarization reflective layer includes a distributed Bragg reflector and a polarization grating stacked with each other.

According to an embodiment of the present disclosure, the distributed Bragg reflector includes a plurality of sub-layers. The polarization grating consists of at least one of the sub-layers located on the light exit side of the distributed Bragg reflector.

Figure 8:
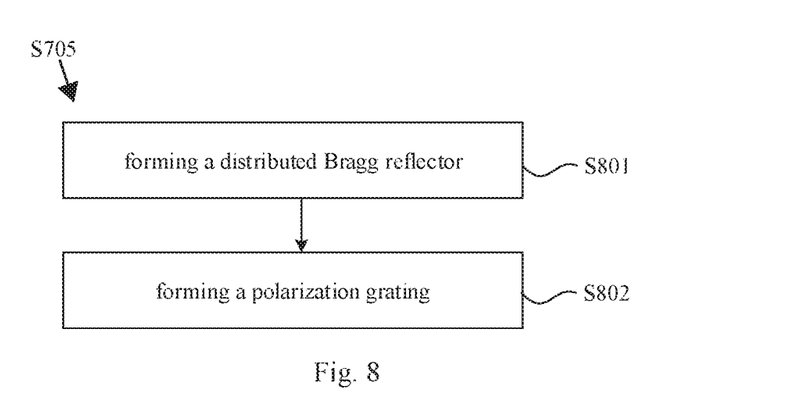
FIG. 8 illustrates a part of the flow chart of a method for manufacturing an organic light emitting display panel according to an embodiment of the present disclosure.

According to an embodiment of the present disclosure, when the panel is a top emission organic light emitting display panel, a polarization reflective layer may be formed on the substrate before the anode is deposited on the substrate, and the final structure is as shown in FIG. 5. Referring to FIG. 8, step S705, that is, the step of forming a polarization reflective layer between the substrate and the first electrode includes steps S801 and S802.

S801: forming a distributed Bragg reflector.

According to an embodiment of the present disclosure, in this step, the distributed Bragg reflector is formed. According to an embodiment of the present disclosure, a plurality of sub-layers are deposited to form a distributed Bragg reflector. According to a specific embodiment of the present disclosure, the distributed Bragg reflector includes a first sub-layer and a second sub-layer that are alternately stacked. That is, the plurality of sub-layers include the first sub-layer and the second sub-layer that are alternately stacked. According to an embodiment of the present disclosure, the first sub-layer has a thickness in a range from 68 to 73 nm, and the second sub-layer has a thickness in a range from 103 to 106 nm. According to a specific embodiment of the present disclosure, the thickness of the first sub-layer may be 71.3 nm, and the thickness of the second sub-layer may be 105 nm. Here, the type of deposition is not particularly limited. For example, according to an embodiment of the present disclosure, PECVD deposition method may be employed. Here, the number of layers of the sub-layers has been described in detail above, and will not be described herein. For example, according to an embodiment of the present disclosure, the total number of layers of the first sub-layer and the second sub-layer may be in a range from 10 to 30. According to a specific embodiment of the present disclosure, the total number of layers of the first sub-layer and the second sub-layer may also be in a range from 15 to 25 layers. Thereby, the panel is made to have a suitable thickness while ensuring a higher reflectivity. Here, the materials and the setting order of the first sub-layer and the second sub-layer are also described in detail above, and are not described herein again. For example, according to an embodiment of the present disclosure, one of the first sub-layer and the second sub-layer may be composed of silicon nitride, and the other of the first sub-layer and the second sub-layer may be composed of silicon oxide. Thereby, the distributed Bragg reflector can be obtained by a simple production process.

S802: forming a polarization grating.

According to an embodiment of the present disclosure, in this step, the polarization grating is formed. According to an embodiment of the present disclosure, the polarization grating is formed using at least one of the sub-layers on the light emit side of the distributed Bragg reflector. Specifically, at least one of the sub-layers on the light emit side of the distributed Bragg reflector is etched to form a plurality of grooves having the same width and equally spaced apart, to form a polarization grating. According to an embodiment of the present disclosure, the number of layers of the sub-layers to be etched needs to be determined according to the thickness of each sub-layer and the height of the polarization grating. Here, the type of etching is not particularly limited. For example, in accordance with an embodiment of the present disclosure, ion beam assisted radical etching may be employed. Here, the parameters of the polarization grating have been described in detail above, and are not described herein again. For example, according to a specific embodiment of the present disclosure, a grating period of the polarization grating may be 200 nm, the height of the polarization grating may be 1 μm, and the duty cycle of the polarization grating may be 0.6. Thereby, the polarization grating can be formed based on the distributed Bragg reflector, which saves cost.

Figure 9:
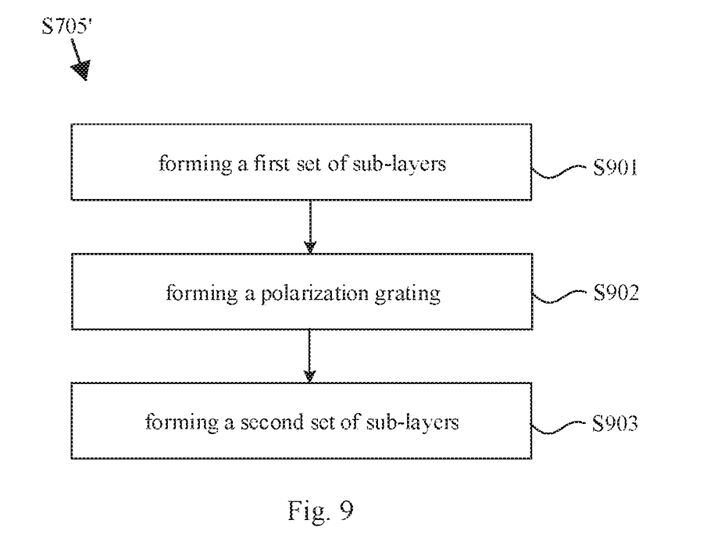
FIG. 9 illustrates a part of the flow chart of a method for manufacturing an organic light emitting display panel according to an embodiment of the present disclosure.

According to another embodiment of the present disclosure, when the panel is a bottom emission organic light emitting display panel, after the display structure is manufactured, a polarization reflective layer is formed directly on a side of the cathode away from the light emitting layer, and the final structure is as shown in FIG. 6. Referring to FIG. 9, step S705', that is, the step of forming the polarization reflective layer on a side of the second electrode away from the light emitting layer includes steps S901 to S902.

In step S901, a first set of sub-layers of the plurality of sub-layers is formed on a side of the second electrode. In step S902, a plurality of grooves having the same width and equally spaced apart are formed in the first set of sub-layers to form the polarization grating. In step S903, a second set of sub-layers is formed on the first set of sub-layers to form the distributed Bragg reflector.

According to a specific embodiment of the present disclosure, the first set of sub-layers and the second set of sub-layers both include a first sub-layer and a second sub-layer that are alternately stacked. The thicknesses of the first and second sub-layers are as described above and will not be described herein. The number of layers of the first and second sub-layers has been described in detail above and will not be described herein. The method for forming the first set and second set of sub-layers includes deposition. Here, the type of deposition is not particularly limited. For example, according to an embodiment of the present disclosure, PECVD deposition may be employed. Here, the materials and the setting order of the first sub-layer and the second sub-layer are also described in detail above, and are not described herein again.

Forming the polarization grating specifically includes etching the first set of sub-layers to form a plurality of grooves having the same width and equally spaced apart. According to an embodiment of the present disclosure, the number of layers of the sub-layers to be etched needs to be determined according to the thickness of each sub-layer and the height of the polarization grating. Here, the type of etching is as described above, and the parameters of the polarization grating have been described in detail above, and are not described herein again.

In the description of the present disclosure, the orientation or position indicated by the terms "upper", "lower" and the like is based on the orientation or position shown in the drawings, and is merely for the convenience of describing the present disclosure and does not require that the disclosure must be constructed and operated in particular orientation, thus which cannot be understood as a limit to the present disclosure.

In the description of the present specification, the description referring to the terms "one embodiment", "another embodiment" or the like means that the specific features, structures, materials, or characteristics described in combination with the embodiments are included in at least one embodiment of the present disclosure. In the present specification, the schematic representation of the above terms is not necessarily directed to the same embodiment or example. Furthermore, the particular features, structures, materials, or characteristics described may be combined in a suitable manner in any one or more embodiments or examples. In addition, various embodiments or examples described in the specification and features of various embodiments or examples may be combined without contradictory conditions. In addition, it should be noted that, in the present specification, the terms "first" and "second" are used for descriptive purposes only, and are not to be construed as indicating or implying a relative importance or implicitly indicate the number of technical features indicated.

While the embodiments of the present disclosure have been shown and described above, it can be understood that the foregoing embodiments are illustrative and are not to be construed as a limit to the scope of the disclosure. The embodiments can be changed, revised, replaced, and modified.

What is claimed is:

1. An organic light emitting display panel comprising:
a substrate;
a first electrode located on the substrate;
a light emitting layer located on a side of the first electrode away from the substrate;
a second electrode located on a side of the light emitting layer away from the first electrode; and
a polarization reflective layer located between the substrate and the first electrode or located on a side of the second electrode away from the light emitting layer,
wherein the polarization reflective layer is configured to reflect and polarize light emitted from the light emitting layer,
wherein the polarization reflective layer is located on a non-light exiting side of the organic light emitting display panel,
wherein the polarization reflective layer comprises a distributed Bragg reflector and a polarization grating which are stacked with each other,
wherein the distributed Bragg reflector comprises a plurality of sub-layers,
wherein the polarization grating consists of at least one of the sub-layers located on a light exit side of the distributed Bragg reflector, and
wherein a grating period of the polarization grating is in a range from 198 to 202 nm, wherein a height of the polarization grating is in a range from 0.9 to 1.1 μm, and wherein a duty cycle of the polarization grating is in a range from 0.5 to 0.7.

2. The organic light emitting display panel according to claim 1, wherein a total number of layers of the plurality of sub-layers is in a range from 10 to 30.

3. A display device comprising the organic light emitting display panel according to claim 2.

4. The organic light emitting display panel according to claim 1, wherein a material of the plurality of sub-layers comprises one of a compound and a single substance of elements of the same group.

5. A display device comprising the organic light emitting display panel according to claim 4.

6. The organic light emitting display panel according to claim 1, wherein the plurality of sub-layers comprise a first sub-layer and a second sub-layer that are alternately stacked, wherein a material of one of the first sub-layer and the second sub-layer comprises silicon nitride, and wherein a material of the other of the first sub-layer and the second sub-layer comprises silicon oxide.

7. The organic light emitting display panel according to claim 6, wherein a thickness of the first sub-layer is in a range from 68 to 73 nm, and wherein a thickness of the second sub-layer is in a range from 103 to 106 nm.

8. The organic light emitting display panel according to claim 1, wherein the first electrode is an anode and the second electrode is a cathode.

9. A display device comprising the organic light emitting display panel according to claim 1.

10. A method for manufacturing an organic light emitting display panel, the method comprising:
providing a substrate;
forming a first electrode on the substrate;
forming a light emitting layer on a side of the first electrode away from the substrate; and
forming a second electrode on a side of the light emitting layer away from the first electrode,
wherein the method further comprises forming a polarization reflective layer between the substrate and the first electrode or on a side of the second electrode away from the light emitting layer,
wherein the polarization reflective layer is configured to reflect and polarize light emitted from the light emitting layer,
wherein the polarization reflective layer is located on a non-light exiting side of the organic light emitting display panel,
wherein the polarization reflective layer comprises a distributed Bragg reflector and a polarization grating which are stacked with each other,
wherein the distributed Bragg reflector comprises a plurality of sub-layers,
wherein the polarization grating consists of at least one of the sub-layers located on a light exit side of the distributed Bragg reflector, and
wherein a grating period of the polarization grating is in a range from 198 to 202 nm, wherein a height of the polarization grating is in a range from 0.9 to 1.1 μm, and wherein a duty cycle of the polarization grating is in a range from 0.5 to 0.7.

11. The method according to claim 10, wherein forming the polarization reflective layer between the substrate and the first electrode comprises:
depositing the plurality of sub-layers on the substrate, so as to form the distributed Bragg reflector; and
forming a plurality of grooves having a same width and equally spaced apart in the at least one of the sub-layers on the light exit side of the distributed Bragg reflector to form the polarization grating.

12. The method according to claim 10, wherein forming the polarization reflective layer on a side of the second electrode away from the light emitting layer comprises:
forming a first set of sub-layers of the plurality of sub-layers on the side of the second electrode;
forming a plurality of grooves having a same width and equally spaced apart in the first set of sub-layers to form the polarization grating; and
forming a second set of sub-layers on the first set of sub-layers to form the distributed Bragg reflector.

13. The method according to claim 10, wherein the plurality of sub-layers comprise a first sub-layer and a second sub-layer that are alternately stacked, wherein a thickness of the first sub-layer is in a range from 68 to 73 nm, and wherein a thickness of the second sub-layer is in a range from 103 to 106 nm,
wherein a total number of layers of the plurality of sub-layers is in a range from 10 to 30, and
wherein a material of one of the first sub-layer and the second sub-layer comprises silicon nitride, and wherein a material of the other of the first sub-layer and the second sub-layer comprises silicon oxide.

* * * * *